(12) United States Patent
Cok

(10) Patent No.: US 7,633,218 B2
(45) Date of Patent: Dec. 15, 2009

(54) OLED DEVICE HAVING IMPROVED LIFETIME AND RESOLUTION

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 534 days.

(21) Appl. No.: 11/536,712

(22) Filed: Sep. 29, 2006

(65) Prior Publication Data

US 2008/0079352 A1    Apr. 3, 2008

(51) Int. Cl.
*H05B 33/04* (2006.01)
*H05B 33/10* (2006.01)

(52) U.S. Cl. .................. 313/503; 313/500; 313/506

(58) Field of Classification Search ......... 313/498–512; 428/690
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,703,436 A | 12/1997 | Forrest et al. | |
| 6,274,980 B1 | 8/2001 | Burrows et al. | |
| 6,348,359 B1 | 2/2002 | Van Slyke et al. | |
| 6,626,721 B1 | 9/2003 | Van Slyke | |
| 6,727,645 B2 | 4/2004 | Tsujimura et al. | |
| 6,812,637 B2 | 11/2004 | Cok et al. | |
| 6,844,957 B2 | 1/2005 | Matsumoto et al. | |
| 6,855,636 B2 | 2/2005 | Theiss et al. | |
| 6,903,378 B2 | 6/2005 | Cok | |
| 7,102,280 B1 * | 9/2006 | Duineveld et al. | 313/504 |
| 2004/0119066 A1 * | 6/2004 | Han et al. | 257/40 |
| 2005/0236981 A1 | 10/2005 | Cok et al. | |
| 2006/0003262 A1 | 1/2006 | Yang et al. | |
| 2006/0057502 A1 | 3/2006 | Okada et al. | |
| 2006/0073667 A1 | 4/2006 | Li et al. | |

OTHER PUBLICATIONS

U.S. Appl. No. 11/087,522, filed Mar. 23, 2005, Miller et al.

* cited by examiner

*Primary Examiner*—Nimeshkumar D. Patel
*Assistant Examiner*—Anne M Hines
(74) *Attorney, Agent, or Firm*—Stephen H. Shaw

(57) ABSTRACT

A light-emitting diode device includes a substrate, and numerous first electrodes formed in a pattern over the substrate in a first dimension. Numerous first shadowing pillars, having a first height, are formed in a second dimension, orthogonal to the first dimension, and over the substrate. One-or-more first light-emitting layer(s) are formed over the first electrodes. Numerous second electrodes are formed in a pattern between the first shadowing pillars over the one-or-more first light-emitting layer(s). Numerous second shadowing pillars, having a second height, are formed in the first dimension over the substrate, wherein the second height is greater than the first height. One or more second light-emitting layer(s) are formed over the second electrodes; and numerous third electrodes are formed in a pattern over the first shadowing pillars, between the second shadowing pillars, and over the one-or-more second light-emitting layer(s).

20 Claims, 13 Drawing Sheets

OLED DEVICE HAVING IMPROVED LIFETIME AND RESOLUTION

FIELD OF THE INVENTION

The present invention relates to organic light-emitting diode devices and, more particularly, to a patterned light-emitting device having stacked, independently controlled light-emitting elements.

BACKGROUND OF THE INVENTION

Organic light-emitting diode (OLED) devices, also referred to as organic electroluminescent (EL) devices, have numerous well-known advantages over other flat-panel display devices currently in the market place. Among the potential advantages is brightness of light emission, relatively wide viewing angle, reduced device thickness, and reduced electrical power consumption compared to, for example, backlit displays.

Applications of OLED devices include active-matrix image displays, passive-matrix image displays, and area-lighting devices such as, for example, selective desktop lighting. Irrespective of the particular OLED device configuration tailored to these broad fields of applications, all OLEDs function on the same general principles. An organic electroluminescent (EL) medium structure is sandwiched between two electrodes. At least one of the electrodes is at least partially light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the OLED is said to be forward biased. Positive charge carriers (holes) are injected from the anode into the EL medium structure, and negative charge carriers (electrons) are injected from the cathode. Such charge carrier injection causes current flow from the electrodes through the EL medium structure. Recombination of holes and electrons within a zone of the EL medium structure results in emission of light from this zone that is, appropriately, called the light-emitting zone or interface. The organic EL medium structure can be formed of a stack of sublayers that can include small molecule layers or polymer layers. Such organic layers and sublayers are well known and understood by those skilled in the OLED art.

Full-color OLED devices may employ a variety of organic materials to emit different colors of light. In this arrangement, the OLED device is patterned with different sets of organic materials, each set of organic materials associated with a particular color of light emitted. Each pixel in an active-matrix full-color OLED device typically employs each set of organic materials, for example to form a red, green, and blue sub-pixel. Patterning is typically done by evaporating layers of organic materials through a mask. In an alternative arrangement, a single set of organic materials emitting broadband light may be deposited in continuous layers with arrays of differently colored filters employed to create a full-color OLED device.

The emitted light is directed towards an observer, or towards an object to be illuminated, through the light transmissive electrode. If the light transmissive electrode is between the substrate and the light emissive elements of the OLED device, the device is called a bottom-emitting OLED device. Conversely, if the light transmissive electrode is not between the substrate and the light-emissive elements, the device is referred to as a top-emitting OLED device. The present invention may be directed to either a top-emitting or bottom-emitting OLED device. In top-emitting OLED devices, light is emitted through an upper electrode or top electrode, typically but not necessarily the cathode, which has to be sufficiently light transmissive, while the lower electrode(s) or bottom electrode(s), typically but not necessarily the anode, can be made of relatively thick and electrically conductive metal compositions which can be optically opaque. Because light is emitted through an electrode, it is important that the electrode through which light is emitted be sufficiently light transmissive to avoid absorbing the emitted light. Typical prior-art materials proposed for such electrodes include indium tin oxide (ITO) and very thin layers of metal, for example silver, aluminum, magnesium or metal alloys including these metals.

OLED devices age as current passes through the emissive materials of the display. Specifically, the emissive materials age in direct proportion to the current density passing through the materials. One approach to dealing with the aging problem, while maintaining the resolution of the display, is to stack two or more OLED light-emitting elements on top of each other thereby allowing the areas of the light-emitting elements to be larger to improve lifetime, and/or allowing more pixels to be provided for a given area, thereby improving resolution. This approach is described in U.S. Pat. No. 5,703,436, entitled "Transparent Contacts for Organic Devices" by Forrest et al., issued Dec. 30, 1997, and U.S. Pat. No. 6,274,980, entitled "Single-Color Stacked Organic Light Emitting Device," by Burrows et al., issued Aug. 14, 2001. Stacked OLEDs utilize a stack of light emitting elements located one above another over a substrate. Each light-emitting element may share one or both electrodes with a neighboring light emitting element in the stack and each electrode is individually connected to an external power source, thereby enabling individual control of each light-emitting element. However, forming such structures is difficult and, especially, providing electrode connections may be problematic.

Referring to FIG. 12, a prior-art stacked OLED device is illustrated having a substrate 10 (either reflective, transparent, or opaque). Over the substrate 10, a first electrode 50 is formed. A first light-emitting layer 52 is formed over the first electrode 50 and a second electrode 54 formed over the first light-emitting layer 52. The first and second electrodes 50 and 54 provide current to the first light-emitting layer 52. An insulating layer 56 may be provided over the second electrode 54 to isolate it electrically from the third electrode 60 formed over the insulating layer 56. A second light-emitting layer 62 is formed over the third electrode 60 and a fourth electrode 64 formed over the second light-emitting layer 62. The third and fourth electrodes 60 and 64 provide current to the second light-emitting layer 62. An insulating layer 66 may be provided over the fourth electrode 64 to isolate it electrically from the fifth electrode 70 formed over the insulating layer 66. A third light-emitting layer 72 is formed over the fifth electrode 70 and a sixth electrode 74 formed over the third light-emitting layer 72. The fifth and sixth electrodes 70 and 74 provide current to the third light-emitting layer 72. Separate power connections 58, 68, 78 may be provided to independently control each of the first, second, and third light-emitting layers 52, 62, 72. The first, second, and third light-emitting layers 52, 62, 72 may emit three colors of light, for example red, green, and blue to form a full-color device.

U.S. Pat. No. 6,844,957 entitled "Three Level Stacked Reflective Display", issued Jan. 18, 2005, by Matsumoto et al., describes a structure and fabrication technology for a reflective, ambient light, low-cost display incorporating a plurality of cells laid out side by side and stacked as many as three levels on top of each other. Each stack of three cells is being driven by an array of TFT's positioned on the bottom layer. Each cell comprises a light transmitting front window, three levels of individual cells RGB (Red, Green, and Blue) stacked on top of each other, each level having its own individual electrode, each electrode being connected by vertical conducting via holes running through each transparent dielectric spacer and being connected to an individual TFT. However, the formation of patterned electrodes and the spacing of vias may be difficult, particularly for devices employing organic layers since the use of masks and photolithographic techniques may damage organic material layers and are limited in resolution.

Alternative devices employing stacked light-emitting layers and color filters are also known. Commonly assigned, co-pending U.S. application Ser. No. 11/087,522, filed Mar. 23, 2005 by Miller et al., which is hereby incorporated in its entirety by reference, describes a full-color OLED display device comprised of a substrate; an array of light-emitting elements, each element comprised of a first EL unit positioned between and in electrical contact with a first pair of electrodes and a second EL unit positioned between and in electrical contact with a second pair of electrodes and located above or below the first EL unit, wherein the first EL unit emits light primarily in only two of the red, green and blue portions of the visible spectrum, and the second EL unit emits light at least in the remaining third portion of the visible spectrum; and a means for selectively filtering the light produced by the first EL unit to filter light from one of the only two of the red, green and blue portions of the visible spectrum in some light-emitting elements and to filter light from the other of the only two of the red, green and blue portions of the visible spectrum in some other light-emitting elements.

U.S. Pat. No. 6,903,378 entitled "Stacked OLED Display Having Improved Efficiency", issued Jun. 7, 2005, by Cok, which is hereby incorporated in its entirety by reference, describes an OLED device having a pixel, including a plurality of light transmissive filters; a first electrode layer defining a corresponding plurality of separately addressable electrodes; a first layer of white light emitting OLED material; a doped organic conductor layer; a second layer of white light emitting OLED material; and a second electrode layer defining a single electrode coextensive with the plurality of color filters. Similarly, US Patent Application 2005/0236981, entitled "OLED Device", by Cok et al, which is hereby incorporated in its entirety by reference, describes an OLED device comprising a first layer of independently addressable light emitting elements; and a second layer of independently addressable light emitting elements located on top of the first layer; wherein one of the first and second layers of independently addressable light emitting elements comprises a patterned array of red and blue light emitting elements, and the other of the first and second layers of independently addressable light emitting elements comprises an array of green light emitting elements. However, neither of these disclosures describes a process for manufacturing the invention. In particular, the formation of a patterned electrode over a layer of organic materials is difficult.

It is known to provide shadowing insulative structures to pattern deposition. For example, U.S. Pat. No. 6,855,636, entitled "Electrode Fabrication Methods For Organic Electro-Luminescent Devices", by Theiss et al., provides a process for selectively thermally transferring insulators onto organic electro-luminescent stacks or layers to electronically isolate adjacent devices upon deposition of electrode material. This can allow the formation of top electrodes for a plurality of organic electro-luminescent devices on a substrate via one deposition step to form a single common top electrode or a plurality of electrodes patterned by shadowing due to the presence of the insulators. U.S. Pat. No. 6,348,359, entitled "Cathode Contact Structures in Organic Electroluminescent Devices", issued Feb. 19, 2002 by Van Slyke et al., and U.S. Pat. No. 6,626,721, entitled "Organic Electroluminescent Device with Supplemental Cathode Bus Conductor", issued Sep. 30, 2006, by Van Slyke, describe passive matrix and active matrix organic electro-luminescent (EL) devices fabricated by using a single mask and employing electrically insulative organic shadowing structures. U.S. Pat. No. 6,727,645 entitled "Organic LED Device" by Tsujimura et al., also describes the use of shadowing structures. However, the structures described do not provide a means for improving the lifetime or resolution of OLED devices.

There is a need therefore for an improved organic light-emitting diode device structure that increases the resolution and improves lifetime.

SUMMARY OF THE INVENTION

In accordance with one embodiment and addressing the aforementioned need, the present invention is directed towards a light-emitting diode device, including a substrate, and numerous first electrodes formed in a pattern over the substrate in a first dimension. Numerous first shadowing pillars, having a first height, are formed in a second dimension, orthogonal to the first dimension, and over the substrate. One-or-more first light-emitting layer(s) are formed over the first electrodes. Numerous second electrodes are formed in a pattern between the first shadowing pillars over the one-or-more first light-emitting layer(s). Numerous second shadowing pillars, having a second height, are formed in the first dimension over the substrate, wherein the second height is greater than the first height. One or more second light-emitting layer(s) are formed over the second electrodes; and numerous third electrodes are formed in a pattern over the first shadowing pillars, between the second shadowing pillars, and over the one-or-more second light-emitting layer(s).

Advantages

The present invention has the advantage that it increases the resolution and lifetime of light-emitting organic display devices.

It will be understood that the figures are not to scale since the individual layers are too thin and the thickness differences of various layers too great to permit depiction to scale.

DETAILED DESCRIPTION OF THE INVENTION

Figure 1A:
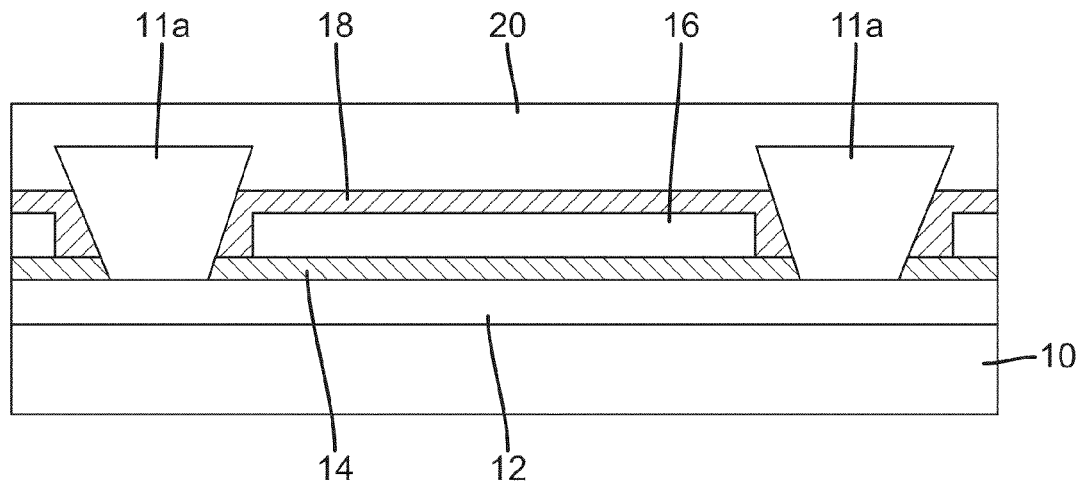
FIGS. 1A and 1B are orthogonal cross sections of an OLED device having stacked emissive layers according to one embodiment of the present invention.
Figure 1B:
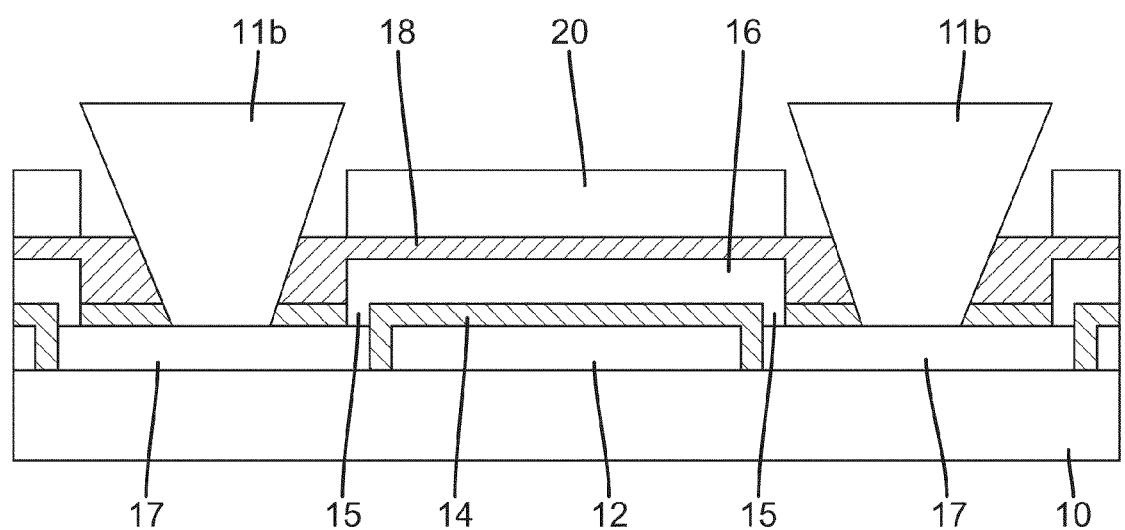
Figure 2:
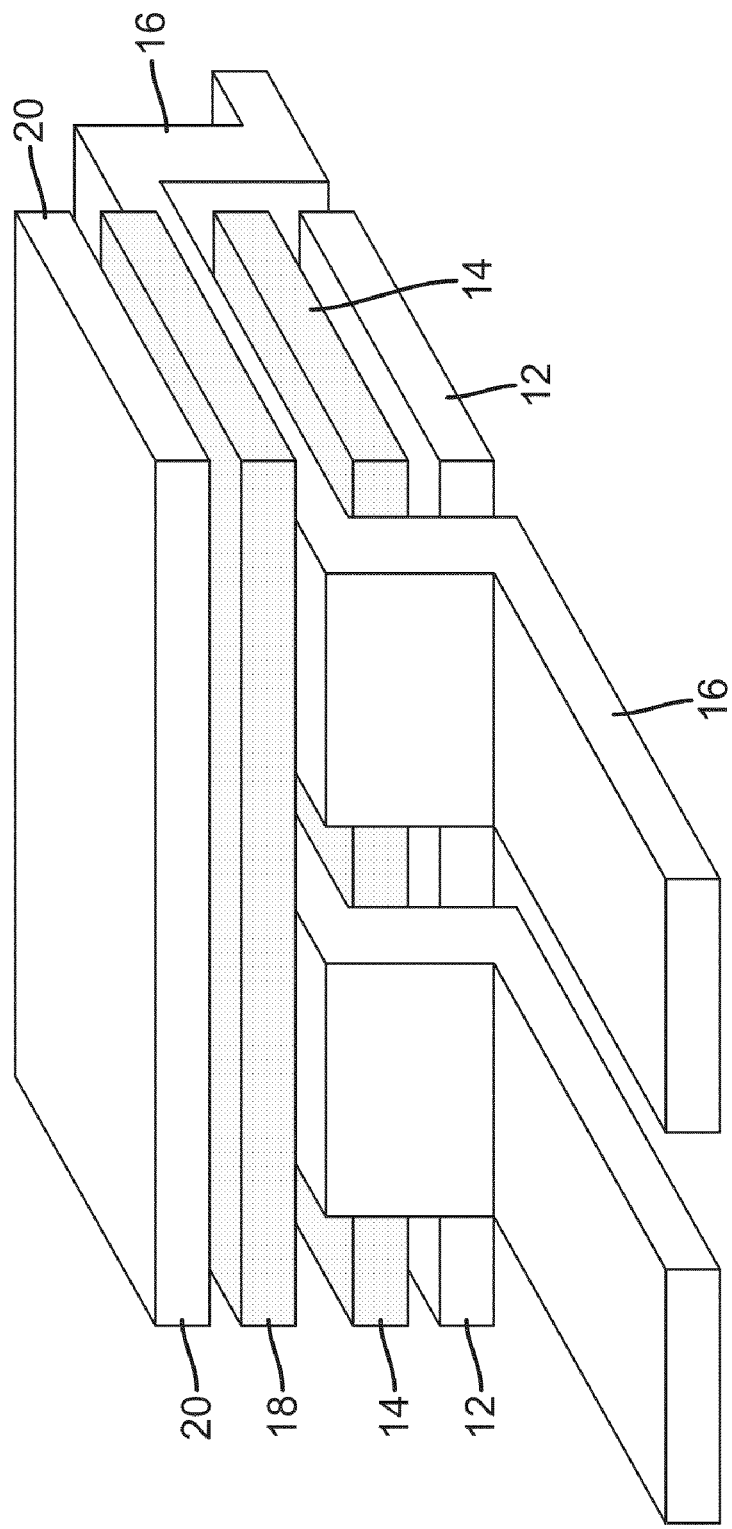
FIG. 2 is a perspective of an OLED device having stacked emissive layers according to an embodiment of the present invention.
Figure 3:
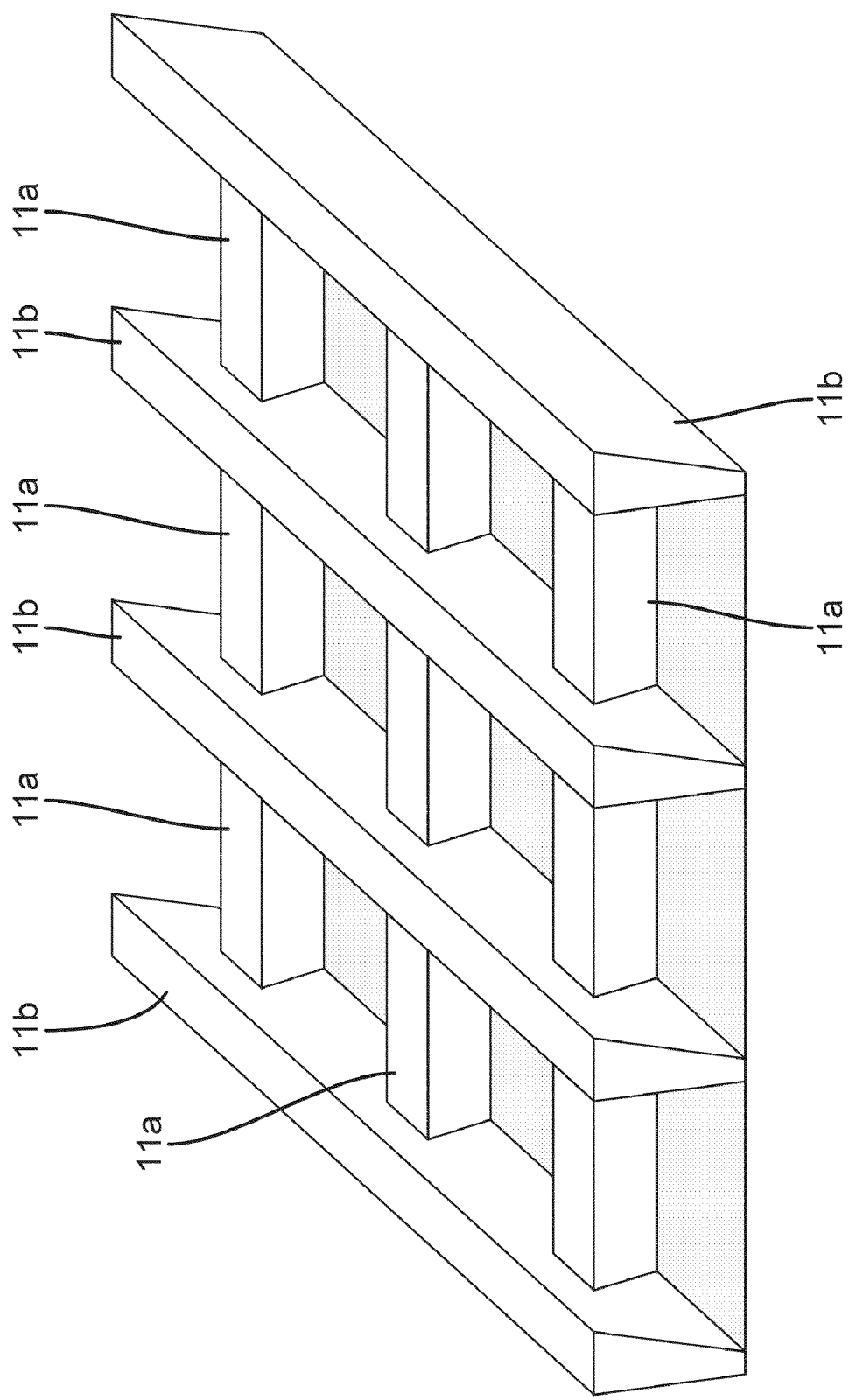
FIG. 3 is a perspective of shadowing pillars in an OLED device having stacked emissive layers according to an embodiment of the present invention.

FIGS. 1A and 1B are orthogonal cross-sections useful in describing the present invention while FIGS. 2 and 3 are three-dimensional views. Referring to these Figures, in accordance with one embodiment of the present invention, a light-emitting diode device comprises a substrate 10, a plurality of first electrodes 12 formed in a pattern over the substrate in a first dimension 6, a plurality of first shadowing pillars 11a formed in a second dimension 8, orthogonal to the first dimension 6, over the substrate 10 having a first height, one-or-more first light-emitting layer(s) 14 formed over the first electrodes 12, a plurality of second electrodes 16 formed in a pattern between the first shadowing pillars 11a over the one-or-more first light-emitting layer(s) 14, a plurality of second shadowing pillars 11b formed in the first dimension over the substrate 10 having a second height, wherein the second height is greater than the first height, one or more second light-emitting layer(s) 18 formed over the second electrodes 16, and a plurality of third electrodes 20 formed in a pattern over the first shadowing pillars 11a between the second shadowing pillars 11b over the one-or-more second light-emitting layer(s) 18. Typically, one stacked light-emitting element is located within each well formed by the shadowing pillars 11a, 11b.

Figure 11A:
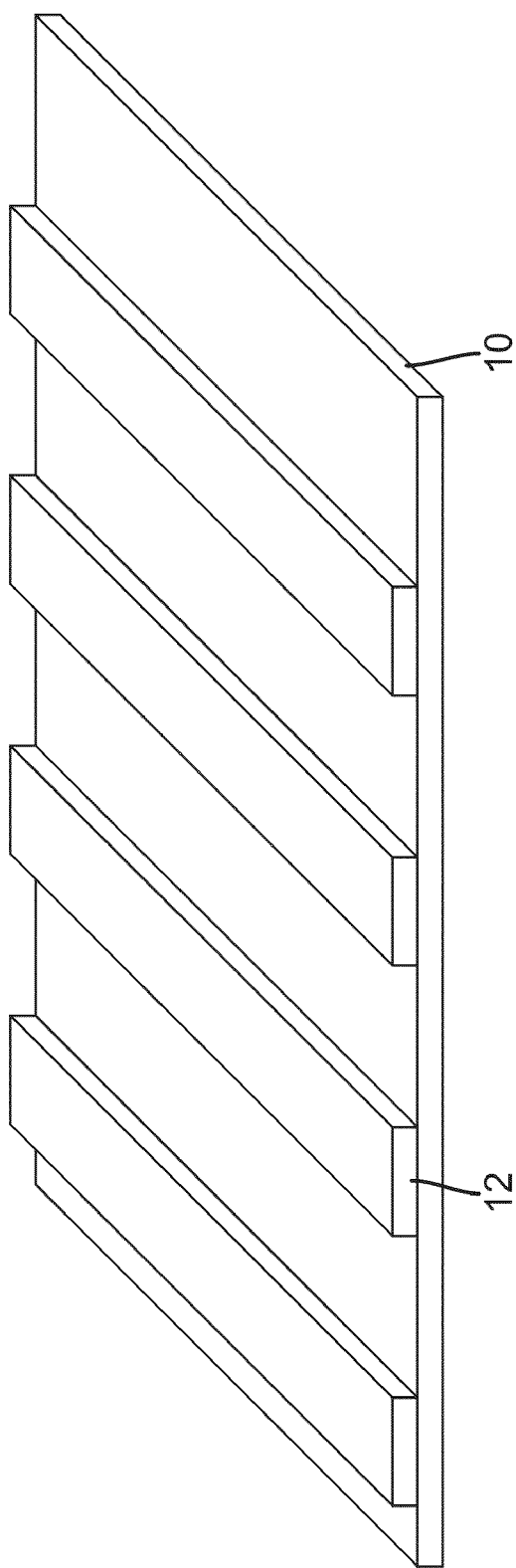
FIGS. 11A-C are perspectives of an OLED device in various stages of construction according to an embodiment of the present invention.
Figure 11B:
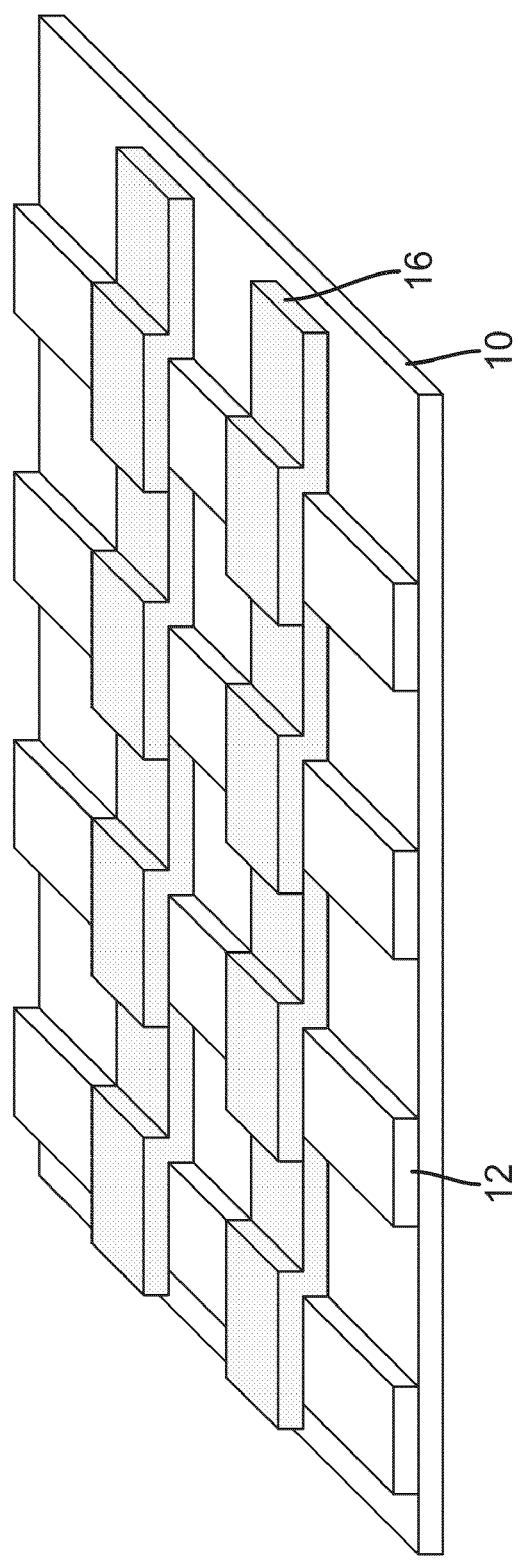
Figure 11C:
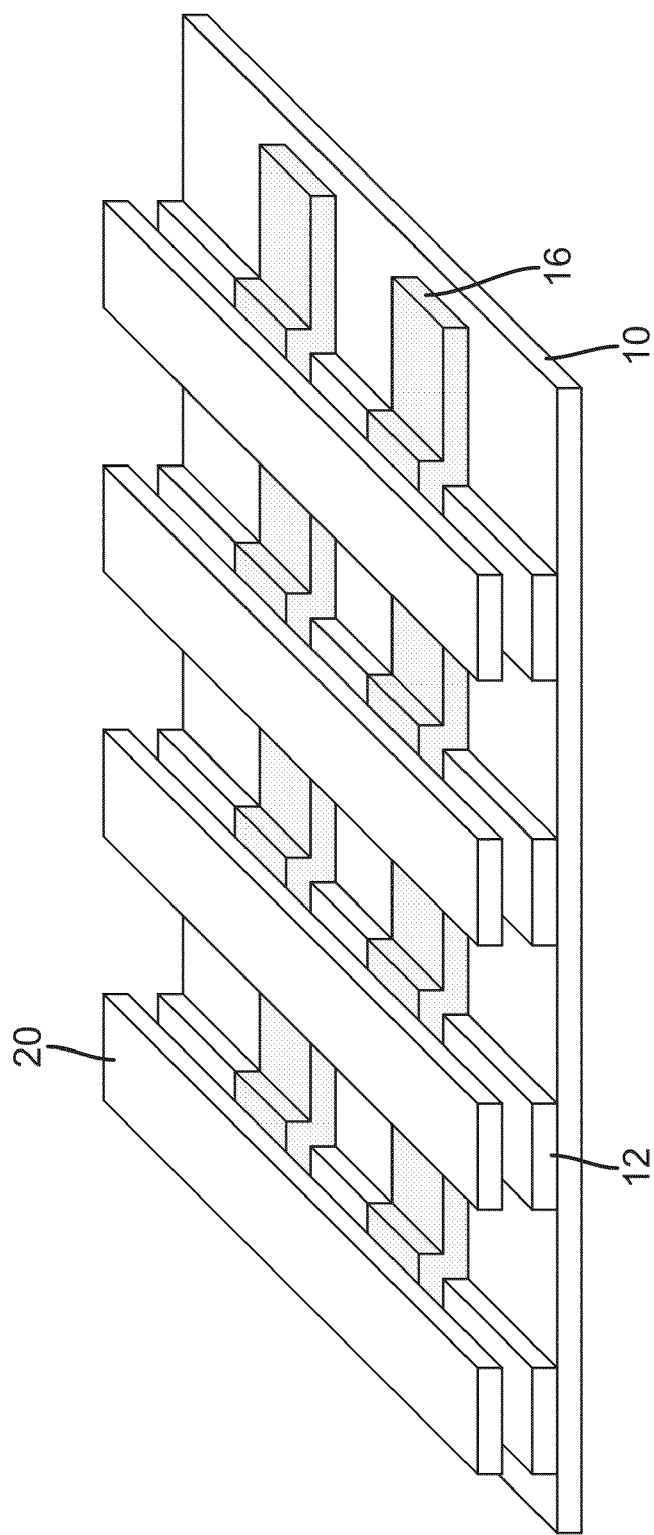
Figure 12:
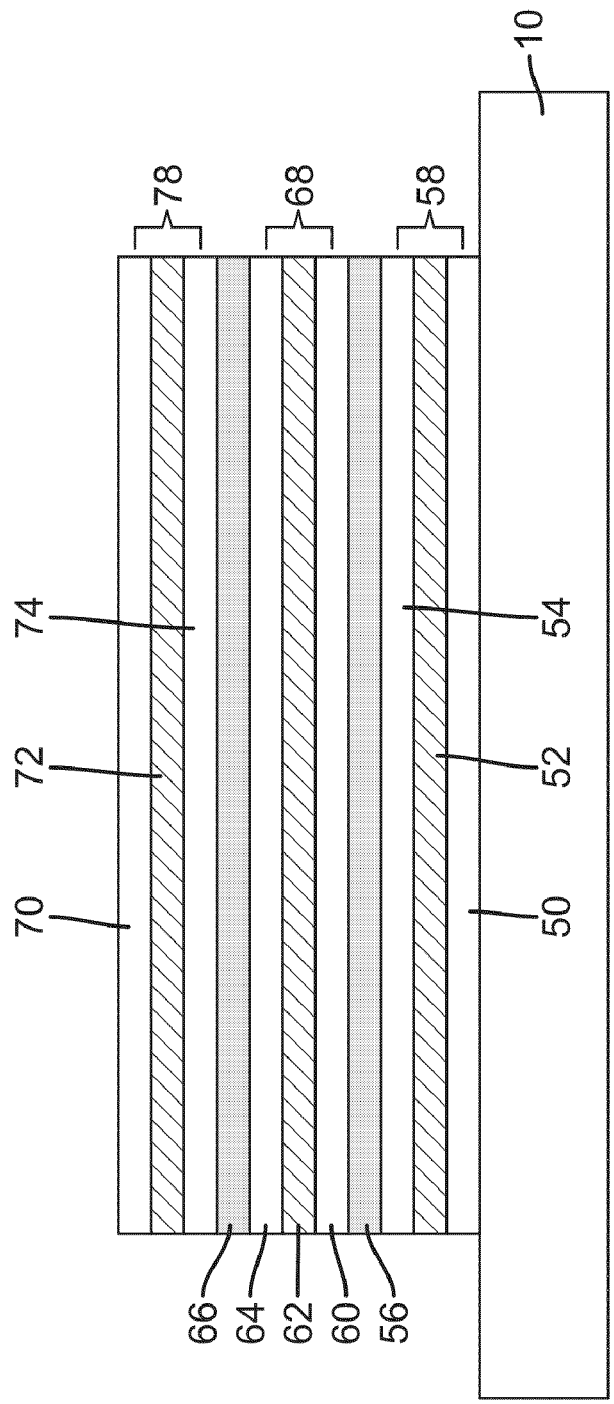
FIG. 12 is a cross section of a prior-art stacked OLED device.

Referring to FIGS. 11A-11C, the electrode patterns are, generally, long rectangular sections extending over the substrate 10 to form long conductors. The first electrodes 12 are illustrated in FIG. 11A, while FIG. 11B shows the layer of second electrodes 16 formed orthogonally over and between the first electrodes 12 to form rectangular, overlapping light-emitting areas. FIG. 11C shows the third electrode layer 20 formed over the first electrodes 12 and second electrodes 16. All of the electrodes may be formed as long busses as is conventionally done in the passive-matrix display art. The rectangular, overlapping light-emitting area between the first and second electrodes 12 and 16 provides means to drive current through the first light-emitting layer 14 while the corresponding rectangular, overlapping light-emitting area between the first and second electrodes 16 and 20 provides means to drive current through the second light-emitting layer 16. For clarity, the pillars are not shown in FIGS. 11A-C. While transparent electrodes are typically formed from metal oxides such as ITO and the reflective electrodes may be formed from a metal such as aluminum, magnesium, or silver, it is also possible to provide metallic edge strips to the transparent electrodes to improve their conductivity.

Figure 4:
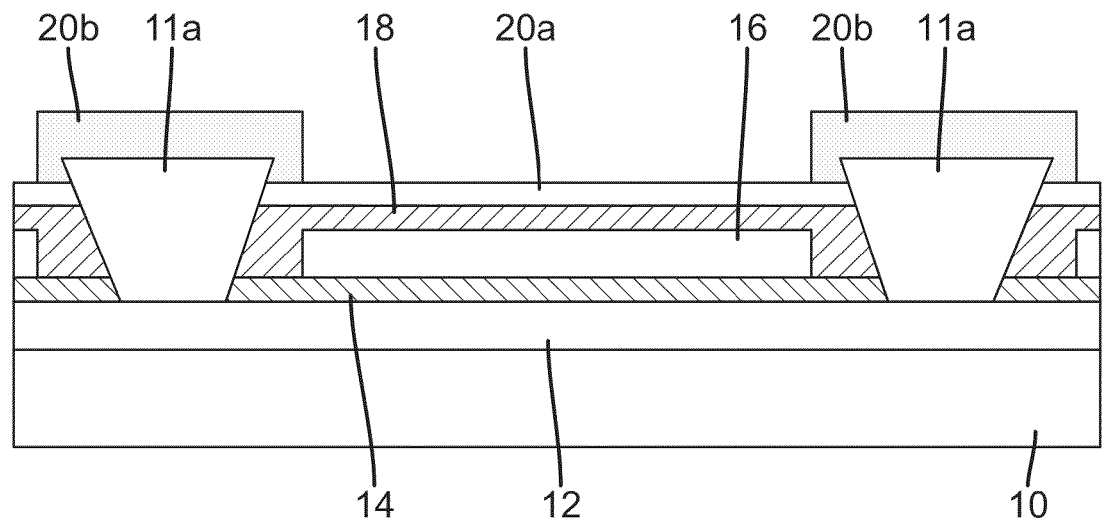
FIG. 4 is a cross section of an OLED device having stacked emissive layers and a bi-layer third electrode according to an embodiment of the present invention.
Figure 5:
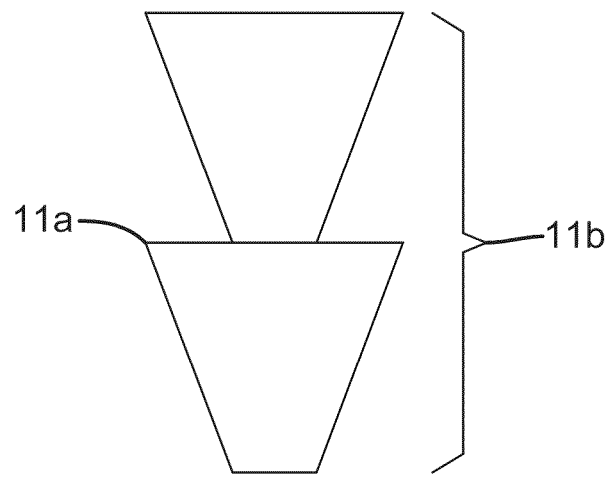
FIG. 5 is a cross section of a shadowing pillar according to an embodiment of the present invention.
Figure 6:
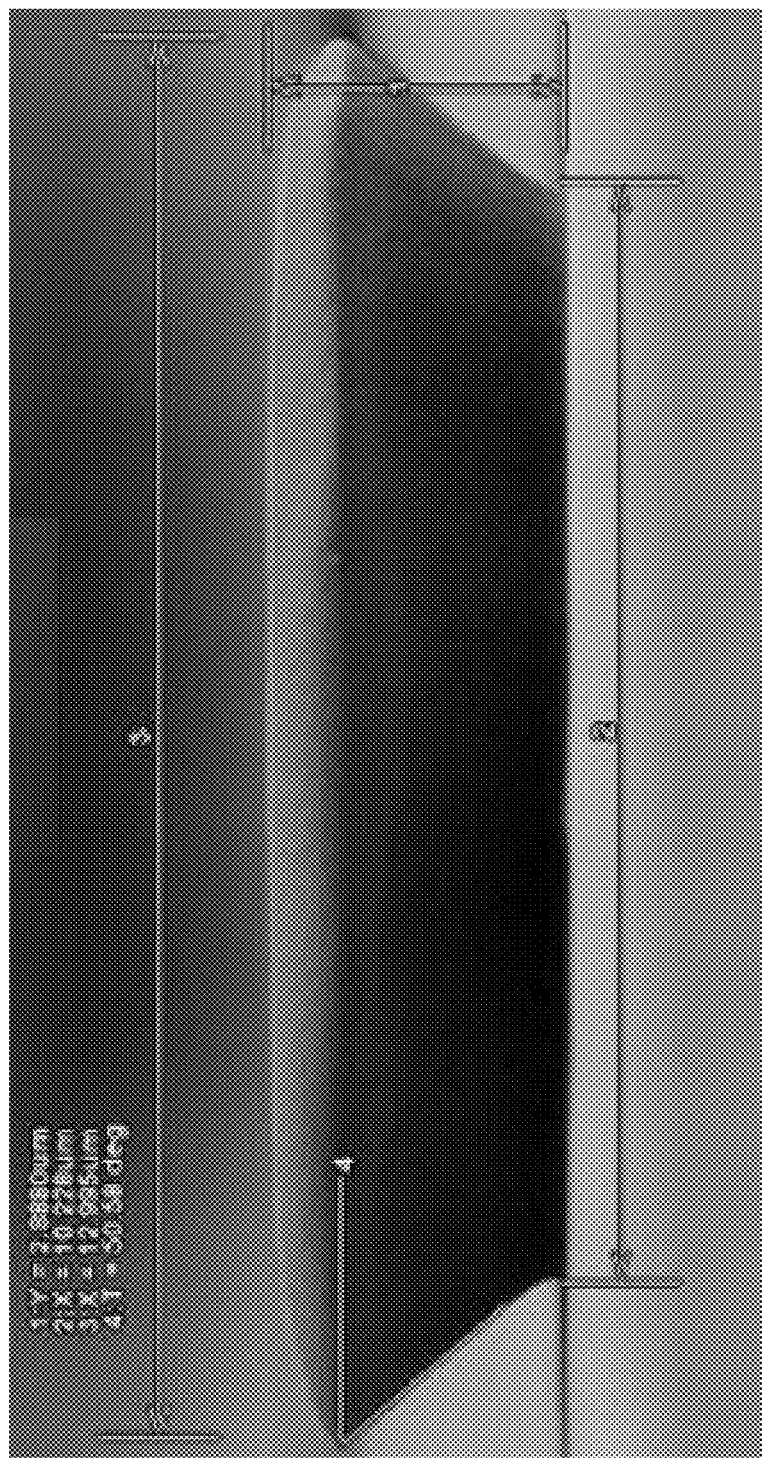
FIG. 6 is a photomicrograph of a shadowing pillar useful in various embodiments of the present invention.

Referring to FIG. 4, the third electrode 20a or 20b may comprise multiple layers. It may be desirable, for example, in a top-emitter embodiment that the portion of the third electrode 20a or 20b over the light-emitting area be as thin as possible to provide the maximum transparency. Hence, an initial deposition of a transparent conductor component 20a (for example, ITO) may be made that may or may not (as shown) extend over the second shadowing pillars 11b. In this case, a second component 20b of third common electrode 20 may be employed over the second shadowing pillars 11b to provide additional conductivity and electrical connectivity (if needed). The second component 20b need not be transparent and can comprise, for example, metal bus lines (for example silver or aluminum or compounds including silver and aluminum) or bus lines made of sintered silver nano-particles as described, for example, in U.S. Pat. No. 6,812,637 entitled, "OLED Display With Auxiliary Electrode", issued Nov. 2, 2004 by Cok et al, US Application 2006/0057502, filed Apr. 12, 2005 by Okada et al., US Application 2006/0073667, filed Oct. 5, 2004 by Li et al., and US Application 2006/0003262, filed Jun. 30, 2004 by Yang et al., all of which are hereby incorporated by reference in their entirety. Referring to FIG. 5, the second shadowing pillars 11b may comprise two small pillars formed one above the other. The shadowing pillars may be formed using conventional photolithographic techniques. Referring to FIG. 6, a shadowing pillar made by applicant and useful for various embodiments of the present invention is shown.

The intersection of the patterned electrodes 12, 16, 20 define light-emitting areas between the shadowing pillars 11a, 11b and provide current to the first and second light-emitting layers 14, 18. Second patterned electrode 16 is shared between the light-emitting layers 14, 18. Hence, current flowing through the light-emitting layer(s) 14 passes through the second electrode 16. Likewise, current flowing through the light-emitting layer(s) 18 passes through the second electrode 16. However, because all three of the electrodes 12, 16, 18 may be independently controlled, the current passing through the light-emitting layer(s) 14 and the current flowing through the light-emitting layer(s) 18 may be independently controlled, so that the amount of light emitted from the light-emitting layers 14, 18, respectively, may be independently controlled. In particular, light may emit from one light-emitting layer and not the other, or light may emit from both light-emitting layers simultaneously.

The present invention may be constructed in several ways. In one exemplary way, according to a method of the present invention, the first shadowing pillars 11a are made after the first electrodes 12 are formed and the second shadowing pillars 11b are made after the second electrodes 16 are formed. In an alternative exemplary method, the first and second shadowing pillars 11a, 11b are formed after the first electrodes 12 are formed, and before the second electrodes 16 are formed. In this case, busses 17 may be formed over the substrate 10, under the second shadowing pillars 11b, to provide current to the second electrodes 16; and a via 15 is formed, for example, by laser ablation, through the first light-emitting layer(s) 14 to expose a contact on the buss 17. Subsequent deposition of the second electrodes 16, over the first and second shadowing pillars 11a, 11b, will form separate and distinct light-emitting areas between the shadowing pillars 11a, 11b that are connected through the vias 15, (also known as channels), to the buss 17; thereby providing means to connect the second electrode 16 to an external driver. The busses 17 may simply connect a second electrode 16 to a neighboring second electrode 16, or may extend over the substrate 10 to form a higher conductivity path for current to flow through the second electrodes 16. The busses 17 may be formed of metal, such as aluminum or silver, in either a top- or bottom-emitter configuration. The busses 17 may also be formed in a common step with the first electrodes 12, if made of the same material, in a top-emitter configuration; or may be formed of different materials than the first electrodes 12 in a different step, for example, in a bottom-emitter configuration.

Figure 8:
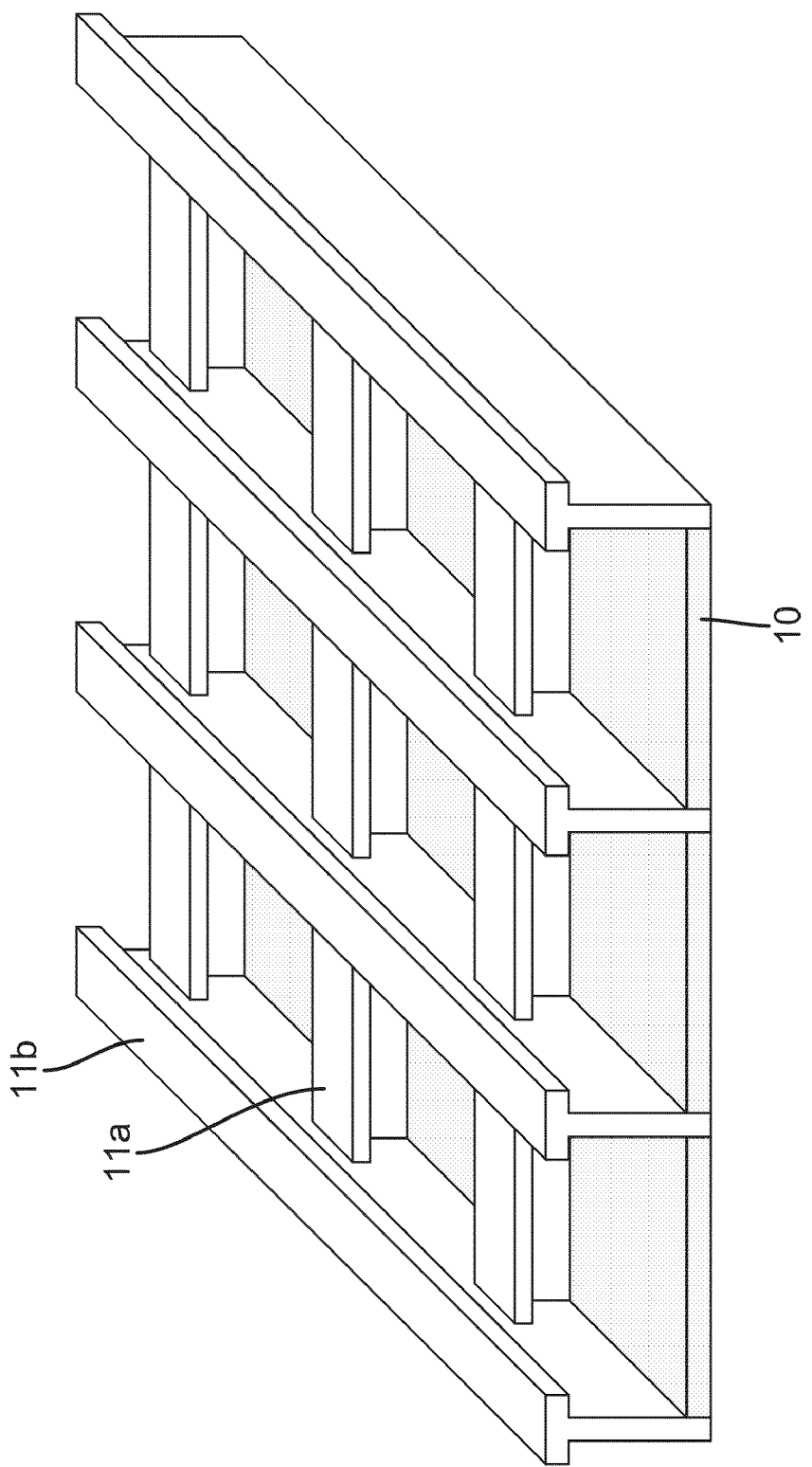
FIG. 8 is a cross section of an alternative shadowing pillar according to another embodiment of the present invention.

A variety of pillars may be employed to form the first and second shadowing pillars 11a, 11b. Referring to FIG. 8, shadowing pillars with an alternative shape are illustrated.

The device of the present invention is preferentially operated as a passive-matrix device, employing external drivers, to separately drive the electrodes 12, 16, 20 at desired voltages, to drive current through the light-emitting layer(s) 14, 18. The device may be operated in one of at least two modes. In a first mode, light emission, from the first light-emitting layer 14 and the second light-emitting layer 18, is temporally alternated, so that first one layer is energized to produce light, and then the second layer is energized to produce light. In this mode, both layers do not emit at the same time. However, the temporal alternation should preferably be done at a sufficiently high frequency that viewers do not observe a flickering effect. In a second mode, both layers are either operated simultaneously or independently. In the first mode, to operate the first light-emitting layer 14 while turning off the second light-emitting layer 18, the electrodes 16, 20 may be held at the same potential, while controlling the current through the first light-emitting layer 14 with electrodes 12 and 16. To operate the second light-emitting layer 18 while turning off the first light-emitting layer 14, the electrodes 12, 16 may be held at the same potential, while controlling the current through the second light-emitting layer 18 with electrode 16.

In the second mode, the first light-emitting layer 14 and the second light-emitting layer 18 are operated simultaneously, so that both light-emitting layers are energized, and produce light at the same time. In this mode, the three electrodes 12, 16, 20 should preferably be held at relatively controlled potential levels. Current passing through the first light-emitting layer 14 is controlled by the potential between first and second electrodes 12, 16, while current passing through the second light-emitting layer 18 is controlled by the potential between second and third electrodes 16, 20. Hence, to provide equal current through both light-emitting layers 14, 18, for example, the potential difference between first and second electrodes 12, 16, respectively, is held to the same potential difference as between electrodes 16, 20.

In one embodiment of the present invention, the OLED device may be a top-emitting device, and the first electrode 12 may be reflective, while the second electrode 16 and third electrode 20 are transparent. In another embodiment of the present invention, the OLED device may be a bottom-emitting device, and the third electrode 20 may be reflective, while the first electrode 12 and the second electrode 16 are transparent.

According to various embodiments of the present invention, the first and second light-emitting layers 14, 18, respectively, may be independently controllable to emit light separately or together. Moreover, the light-emitting layers may each comprise a common light-emitting material layer over all of the light-emitting areas. Alternatively, the light-emitting materials, comprising the light-emitting layers, may be patterned, so that one light-emitting layer in one light-emitting area will employ one kind of light-emitting material to emit light of one color, while a different kind of light-emitting material may be employed in a different light-emitting area to emit light of a different color. Typically, in the prior art, organic materials are evaporated in layers over a substrate to form light-emitting layer(s). If no masking is employed, all of the light-emitting areas over the substrate have the same organic materials, and will emit the same color of light in response to a current. If a precision shadow mask is employed, different light-emitting materials may be applied to different light-emitting areas. According to alternative embodiments of the present invention, either the first or second light-emitting layer(s) may be patterned with different light-emitting materials that can emit different colors of light in different light-emitting areas. Alternatively, either the first or second light-emitting layer(s) may employ the same light-emitting materials and emit the same color of light in different light-emitting areas.

In a particular embodiment of the present invention, the patterned electrodes may form a plurality of distinct and separate light-emitting areas, and the first light-emitting layer(s) may emit the same first color of light in each of the plurality of light-emitting areas, and the second light-emitting layer(s) may emit the same second color of light in each of the plurality of light-emitting areas; wherein the first and second colors are different colors. A variety of different first and second color combinations may be employed. In some useful embodiments, complementary colors can be employed together to form a white light when both the first and second light-emitting layers are energized simultaneously. For example, one of the first or second light-emitting layer(s) may emit green light, and the other of the first or second light-emitting layers may emit magenta light; or one of the first or second light-emitting layer(s) may emit blue light and the other of the first or second light-emitting layers may emit yellow light; or one of the first or second light-emitting layer(s) may emit red light, and the other of the first or second light-emitting layers may emit cyan light. In another example, the two layers may each emit a secondary color of light. That is, the two layers may be formed to emit any two colors of light from the list, including cyan, yellow, and magenta.

Figure 7:
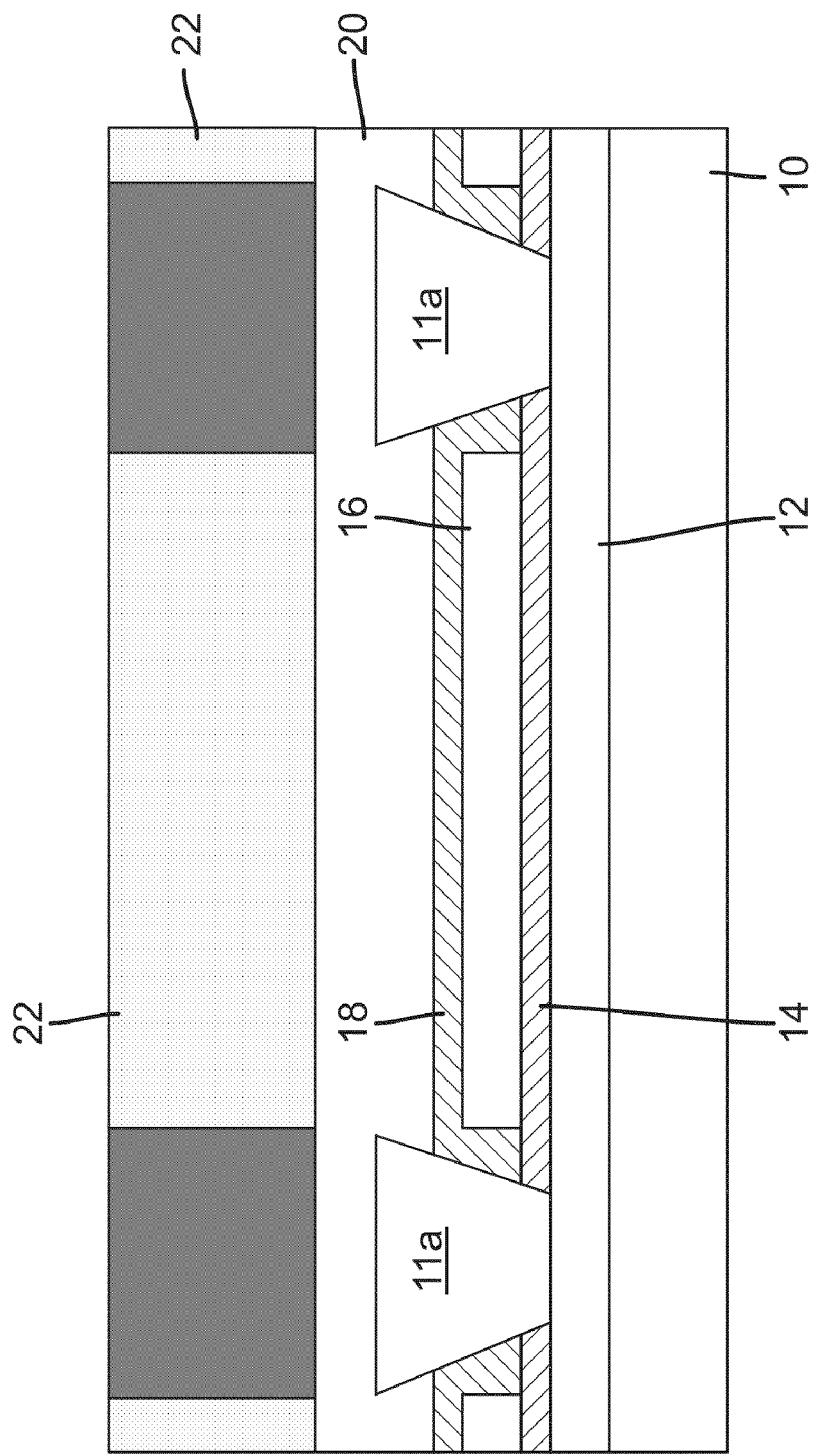
FIG. 7 is a cross section of an OLED device having color filters and a black matrix according to an embodiment of the present invention.

This embodiment may be particularly useful in combination with color filters, as shown in FIG. 7. Different color filters may be employed in different light-emitting areas and formed adjacent to the first or third electrodes, depending on the OLED configuration. Referring to FIG. 7, a color filter 22 is employed in a top-emitter configuration to filter the light output by the first and second light-emitting layers 14 and 18, respectively. Such an arrangement is useful to provide a full-color device without the need to pattern, (for example, with a shadow-mask), the light-emitting layers 14, 18. According to various disclosures in the prior art, a single, white-light-emitting layer, in combination with patterned red, green, and blue color filters, can form a full-color device. However, such a prior-art arrangement is inefficient, because only approximately one third of the white light will pass through each of the color filters. In contrast, the present invention provides an improved energy efficiency by employing complementary colored emitters (e.g. green and magenta), together with patterned color filters, that transmit two colors of light, rather than one color, (e.g., yellow). In this example, if the green light-emitting layer is energized to produce green light, it may pass through the yellow filter with little absorption. If the magenta light-emitting layer is energized to produce magenta light, it may pass through the yellow filter to produce red, while the blue component of the magenta light will be absorbed. If a cyan filter is employed, the blue component of the magenta light may pass through, while the red component of the magenta light is absorbed. In this embodiment, only one third of the light is absorbed at each light-emitting area, rather than the two thirds of the prior-art example. Hence, a full-color device may be obtained, using unpatterned light-emitting layers and a patterned color filter array having two colors, which has a higher efficiency than the conventional white emitter with red, green, and blue color filters. Similarly, blue and yellow emitters may be employed with cyan and magenta filters; red and cyan emitters may be employed with yellow and magenta filters. In the case where the two layers each emit a secondary color of light, cyan and yellow emitters may be employed with magenta and green filters, cyan and magenta emitters may be employed with blue and yellow filters, and yellow and magenta emitters may be employed with red and cyan filters.

In an alternative embodiment of the present invention, the patterned electrodes may form a plurality of distinct and separate light-emitting areas, and either the first or second light-emitting layer(s) may emit light of different colors, in different light-emitting areas, and the other of the first or second light-emitting layer(s) may emit light of the same color in all light-emitting areas. For example, the patterned light-emissive layer(s) may be patterned to emit red and blue light in different light-emitting areas, while the unpatterned light-emissive layer may emit green light. In this case, the resolution of the device is increased.

In yet another embodiment of the present invention, the patterned electrodes may form a plurality of distinct and separate light-emitting area, and both of the first and second light-emitting layer(s) may emit light of different colors in different light-emitting areas.

Figure 9:
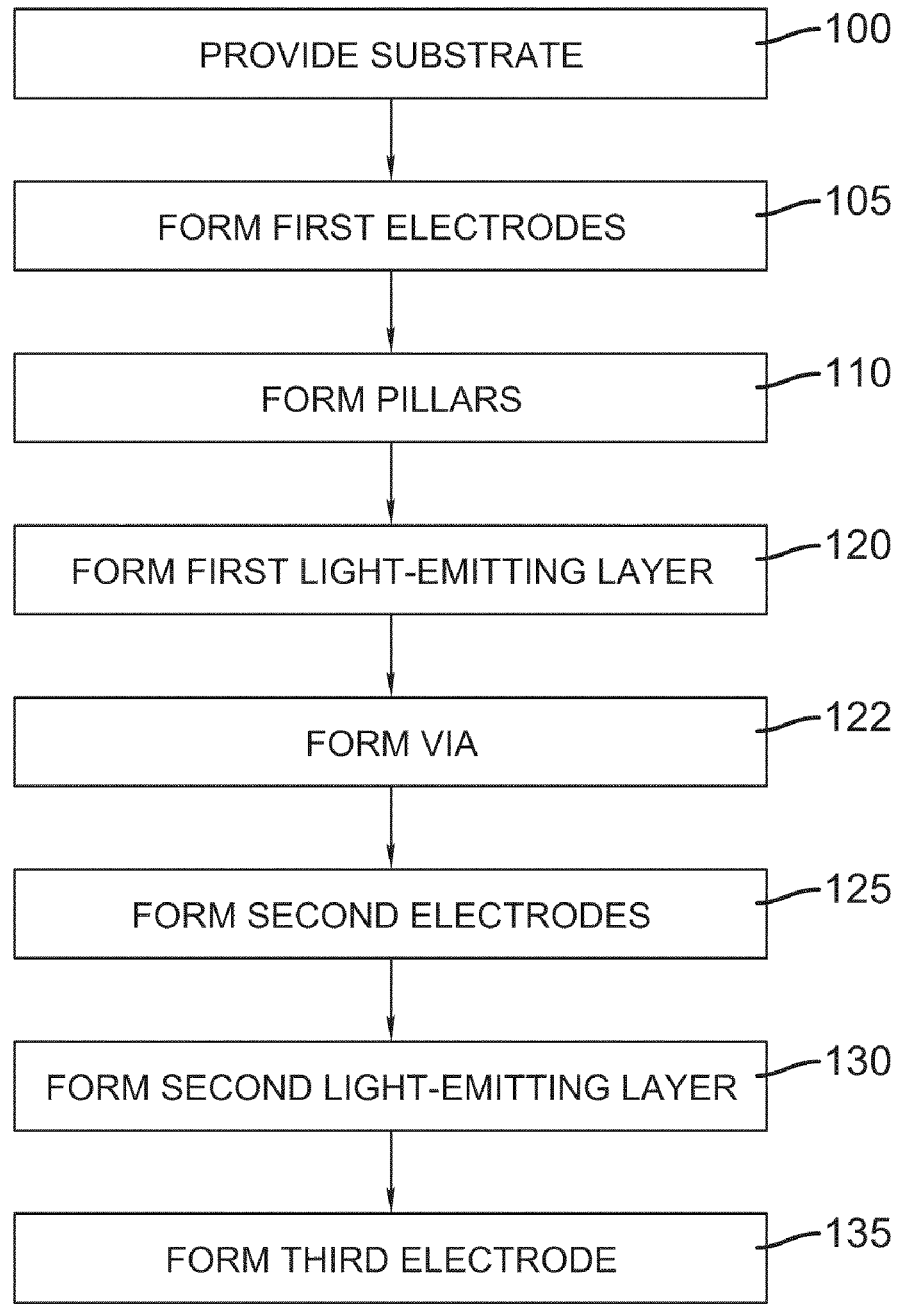
FIG. 9 is a flow diagram illustrating a method of making an embodiment of the present invention.

Referring to FIG. 9, a method of making a light-emitting diode device, according to the present invention, comprises the steps of providing a substrate 100, forming a plurality of first electrodes and a plurality of busses in a pattern over the substrate in a first dimension 105, forming a plurality of first shadowing pillars 110, having a first height, in a second dimension, orthogonal to the first dimension, and over the substrate. Additionally, a plurality of second shadowing pillars, having a second height, are formed in the first dimension over the substrate, wherein the second height is greater than the first height. Step 120 forms one-or-more first light-emitting layer(s) over the first electrodes. Step 125 forms a plurality of second electrodes in a pattern between the first and second shadowing pillars, and over the one-or-more first light-emitting layer(s), hence connecting each of the second electrodes in one dimension to a different buss and in the other dimension to a common buss. Step 130 forms one or more second light-emitting layer(s) over the second electrodes, while step 135 forms a plurality of third electrodes, in a pattern, over the first shadowing pillars, between the second shadowing pillars, over the one-or-more second light-emitting layer(s). A via may be formed 122 through the first organic light-emitting layer(s) to connect the busses to the second electrodes.

Figure 10:
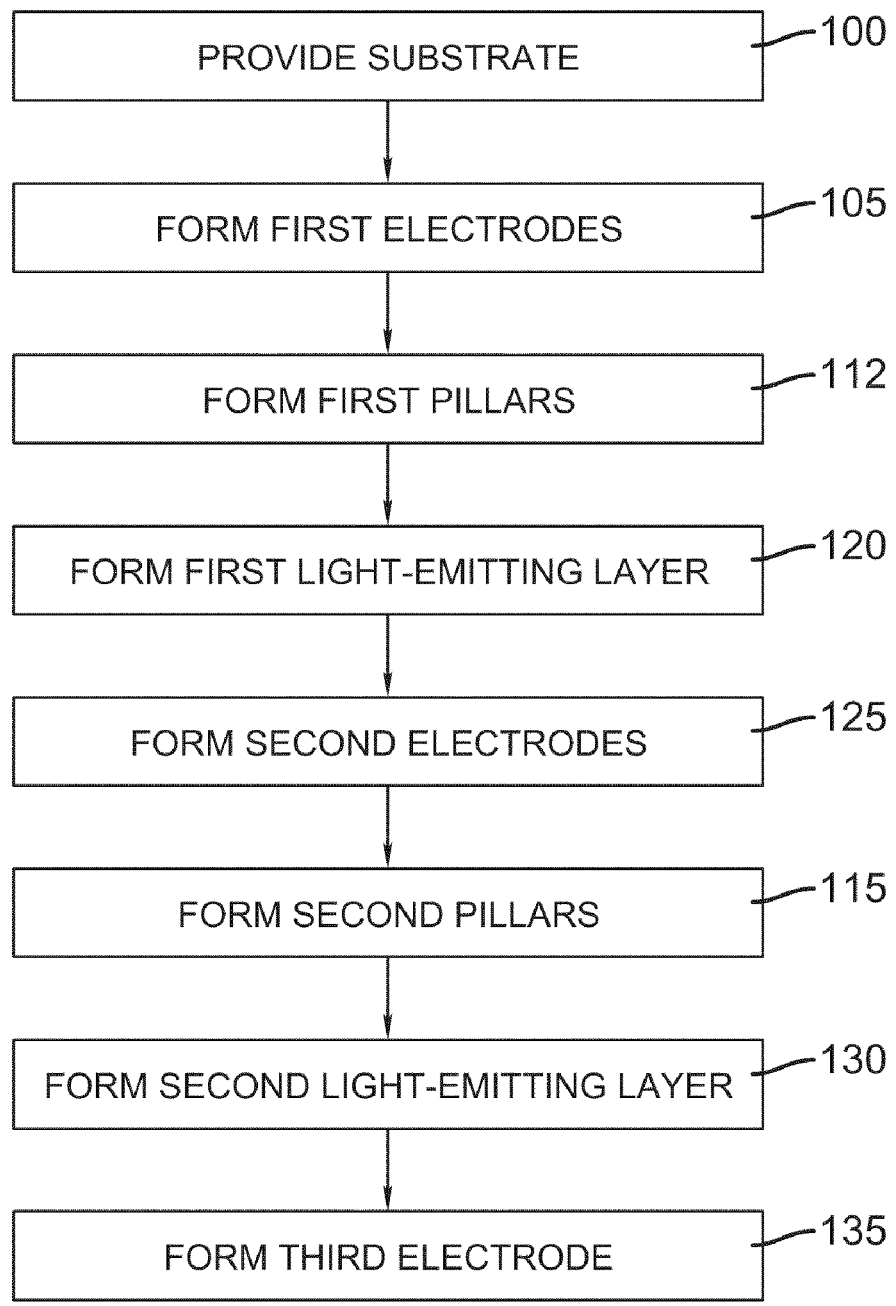
FIG. 10 is a flow diagram illustrating an alternative method of making an embodiment of the present invention.

Referring to FIG. 10, in an alternative embodiment for a method of making a light-emitting diode device, following inclusive steps are described: providing a substrate 100; step 105 forms a plurality of first electrodes in a pattern over the substrate in a first dimension; step 112 forms a plurality of first shadowing pillars, having a first height, in a second dimension, orthogonal to the first dimension, over the substrate, while step 120 forms one-or-more first light-emitting layer(s) over the first electrodes. Step 125 forms a plurality of second electrodes in a pattern between the first shadowing pillars over the one-or-more first light-emitting layer(s); step 115 forms a plurality of second shadowing pillars, having a second height, in the first dimension over the substrate, wherein the second height is greater than the first height. Step 130 forms one or more second light-emitting layer(s) over the second electrodes; and step 135 forms a plurality of third electrodes in a pattern over the first shadowing pillars between the second shadowing pillars over the one-or-more second light-emitting layer(s).

The present invention provides an improvement in that the deposition of the second and third electrodes 16 and 20, respectively, and the light-emitting layers do not require patterning or masks to for specific light-emitting areas. The shadowing pillars may be constructed employing photolithography and masks, but they subsequently serve to separate the electrodes as they are deposited. The use of a via, (otherwise known as a channel), serves to connect the second electrodes, if needed. The shadowing pillars 11 at each side of the light-emitting areas are formed such that the top portion of the pillar 11 is wider than the bottom portion. Therefore, any deposition process, such as sputtering, that relies upon a directional deposition will not form material in the undercut areas at the bottom of the shadowing pillars 11. The grid formed by the shadowing pillars may be continuous and effectively form a plurality of wells with shadowing walls. The grid may have rectangular openings corresponding to the light-emitting areas; alternatively, other shapes may be employed. Typically, each well formed by the grid defines a single, stacked light-emitting element. After the second electrode 16 is deposited, the second light-emitting layer(s) 18 may be deposited in a fashion similar to that of the first light-emitting layer 14. Over the second light-emitting layer(s) 18, the third electrode 20 is deposited. While the third electrode 20 may be formed in a patterned arrangement like the second electrode 16, it is difficult to form vias through the second electrode 16. Laser ablation is much more difficult to perform through transparent metal oxides than through organic materials, and photolithographic processes may very well destroy the second (and first) light-emitting layer(s) 18 and 14, respectively. Hence, third electrode 20 is patterned with the second shadowing pillars 11b. To enable construction of third electrode 20, the height of the first shadowing pillars 11a must be chosen to be somewhat greater than that of the second electrodes 16, so that the deposition of the third electrode 20 can be continuous over the tops of the first shadowing pillars 11a without causing any breaks in the third electrode 20. The third electrode 20 may be thicker than the second electrode 16 to help maintain the continuity of the third electrode 20. In a bottom emitter configuration, a very thick layer of reflective metal (e.g. 400 nm or more) may be employed. In a top-emitter configuration, a transparent conductor, such as ITO, may be employed.

The deposition of metal and metal oxide layers using techniques such as sputtering and evaporation are also known, as is the use of shadow masks for patterning. The evaporation of organic materials with and without masks are likewise known in the art. Shadowing pillars 11a, 11b may be formed using photo-resistive materials and etchants. The performance of the present invention may be improved by employing light scattering techniques as described in, for example, co-pending, commonly assigned U.S. Ser. No. 11/065,082, filed Feb. 24, 2005, and entitled, "OLED Device Having Improved Light Output" by Cok, which is hereby incorporated by reference in its entirety.

In accordance with other embodiments of the present invention, the order of the organic layers within light-emitting layers 14 or 18 may be inverted with respect to each other, thereby changing the direction of current flow through the light-emitting layers and the electronic circuit controlling the current flow. Alternatively, the order may not be inverted.

Light-emitting devices of this invention can employ various well-known optical effects in order to enhance their properties, if desired. This includes optimizing layer thicknesses to yield maximum light transmission, providing anti-glare or anti-reflection coatings over the display, or providing colored, neutral density, or color conversion filters over the display. Filters, and anti-glare or anti-reflection coatings may be specifically provided over the cover or as part of the cover.

The present invention may be practiced with passive-matrix OLED devices or with inorganic light-emitting diodes. It may be employed in display devices or in area illumination devices. In an exemplary embodiment, the present invention is employed in a flat-panel OLED device, composed of small molecule or polymeric OLEDs, as disclosed in, but not limited to U.S. Pat. No. 4,769,292, issued Sep. 6, 1988 to Tang et al.; and U.S. Pat. No. 5,061,569, issued Oct. 29, 1991 to VanSlyke et al. Many combinations and variations of organic light-emitting displays can be used to fabricate such a device, including both active- and passive-matrix OLED displays, having either a top- or bottom-emitter architecture.

The invention has been described in detail with particular reference to certain preferred embodiments thereof, but one skilled in the art understands that variations and modifications can be effected that remain within the spirit and scope of the invention.

PARTS LIST 6 first dimension
8 second dimension
10 substrate
11, 11a, 11b shadowing pillars
12 first electrode
14 first light-emitting layers
15 via
16 second electrode
17 buss
18 second light-emitting layers
20 third electrode
20a, 20b third electrode component
22 color filter
50 electrode
52 light-emitting layer
54 electrode
56 insulating layer
58 power connections
60 electrode
62 light-emitting layer
64 electrode
66 insulating layer
68 power connections
70 electrode
72 light-emitting layer
74 electrode
78 power connections
100 provide substrate step
105 form first electrodes step
110 form shadowing pillars step
112 form first shadowing pillars step
115 form second shadowing pillars step
120 form first light-emitting layer(s) step
122 form via step
125 form second electrode step
130 form second light-emitting layer(s) step
135 form third electrode step

The invention claimed is:

1. A light-emitting diode device, comprising:
a) a substrate;
b) a plurality of first electrodes formed in a pattern over the substrate in a first dimension;
c) a plurality of first shadowing pillars, having a first height, and formed in a second dimension, orthogonal to the first dimension, over the substrate;
d) one-or-more first light-emitting layer(s) formed over the first electrodes;
e) a plurality of second electrodes formed in a pattern between the first shadowing pillars over the one-or-more first light-emitting layer(s);
f) a plurality of second shadowing pillars, having a second height, and formed in the first dimension over the substrate, wherein the second height is greater than the first height;
g) one or more second light-emitting layer(s) formed over the second electrodes; and
h) a plurality of third electrodes formed in a pattern over the first shadowing pillars between the second shadowing pillars over the one-or-more second light-emitting layer(s).

2. The light-emitting diode device of claim 1, wherein the first shadowing pillars are formed upon the first electrodes and the second shadowing pillars are formed upon the second electrodes.

3. The light-emitting diode device of claim 1, wherein the first shadowing pillars are formed upon the first electrodes and the second shadowing pillars are formed between the first electrodes.

4. The light-emitting diode device of claim 1, further comprising busses formed over the substrate, under the second shadowing pillars, and connected to the second electrode.

5. The light-emitting diode device of claim 4, wherein the busses are connected to the second electrode through a via.

6. The light-emitting diode device of claim 1, wherein the third electrodes are electrically connected over the first shadowing pillars and separated by the second shadowing pillars.

7. The light-emitting diode device of claim 1, wherein the first and second electrodes are transparent and the third electrodes are reflective.

8. The light-emitting diode device of claim 1, wherein the first electrodes are reflective and the second and third electrodes are transparent.

9. The light-emitting diode device of claim 1, further comprising electrical signal drivers connected to the first, second, and third electrodes to drive current through the first and second light-emitting layer(s) to emit light therefrom.

10. The light-emitting diode device of claim 9, wherein the electrical signal drivers alternately drive current through either the first or second light-emitting layer(s) to emit light from either the first or second light-emitting layer(s).

11. The light-emitting diode device of claim 9, wherein the electrical signal drivers simultaneously drive current through both the first and second light-emitting layer(s) to simultaneously emit light from both of the first and second light-emitting layer(s).

12. The light-emitting diode device of claim 1, wherein the first and second light-emitting layer(s) emit different colors of light.

13. The light-emitting diode device of claim 1, wherein both of the first and second light-emitting layer(s) are patterned.

14. The light-emitting diode device of claim 1, wherein neither the first nor second light-emitting layer(s) is patterned.

15. The light-emitting diode device of claim 1, wherein either the first or second light-emitting layer(s) are patterned and the other light-emitting layer is not.

16. The light-emitting diode device of claim 1, further comprising a patterned array of color filters located adjacent to the first or third electrodes.

17. A method of making a light-emitting diode device, comprising the steps of:
a) providing a substrate;

b) forming a plurality of first electrodes and a plurality of busses in a pattern over the substrate in a first dimension;
c) forming a plurality of first shadowing pillars, having a first height, in a second dimension orthogonal to the first dimension, and over the substrate;
d) forming a plurality of second shadowing pillars, having a second height, in the first dimension, and over the substrate, wherein the second height is greater than the first height;
e) forming one-or-more first light-emitting layer(s) over the first electrodes;
f) forming a plurality of second electrodes in a pattern, between the first and second shadowing pillars, over the one-or-more first light-emitting layer(s), and connecting each of the second electrodes to a different buss;
g) forming one or more second light-emitting layer(s) over the second electrodes; and
h) forming a plurality of third electrodes, in a pattern over the first shadowing pillars, between the second shadowing pillars, and over the one-or-more second light-emitting layer(s).

18. The method of claim 17, further comprising the step of forming a via through the first organic light-emitting layer(s) to connect each buss to at least one second electrode.

19. The light-emitting diode device of claim 18, wherein the via is formed by laser ablation.

20. A method of making a light-emitting diode device, comprising the steps of:
a) providing a substrate;
b) forming a plurality of first electrodes in a pattern over the substrate in a first dimension;
c) forming a plurality of first shadowing pillars, having a first height, in a second dimension orthogonal to the first dimension, and over the substrate;
d) forming one-or-more first light-emitting layer(s) over the first electrodes;
e) forming a plurality of second electrodes in a pattern, between the first shadowing pillars, and over the one-or-more first light-emitting layer(s);
f) forming a plurality of second shadowing pillars, having a second height, in the first dimension, and over the substrate, wherein the second height is greater than the first height;
g) forming one or more second light-emitting layer(s) over the second electrodes;
h) forming a plurality of third electrodes in a pattern over the first shadowing pillars, between the second shadowing pillars, and over the one-or-more second light-emitting layer(s).

* * * * *